United States Patent [19]
Bosch et al.

[11] Patent Number: 5,448,629
[45] Date of Patent: * Sep. 5, 1995

[54] AMPLITUDE DETECTION SCHEME FOR OPTICAL TRANSMITTER CONTROL

[75] Inventors: Fridolin L. Bosch; Ton V. Nguyen, both of Bethlehem, Pa.

[73] Assignee: AT&T Corp., Murray Hill, N.J.

[*] Notice: The portion of the term of this patent subsequent to Dec. 13, 2011 has been disclaimed.

[21] Appl. No.: 136,358

[22] Filed: Oct. 14, 1993

[51] Int. Cl.$^6$ .......................................... H04B 10/04
[52] U.S. Cl. .................................. 359/187; 359/184; 359/161; 372/38; 375/238
[58] Field of Search ................. 359/110, 153, 161–162, 359/180–181, 184–187; 372/31, 38; 375/22

[56] References Cited

U.S. PATENT DOCUMENTS

| | | | |
|---|---|---|---|
| 4,471,494 | 8/1982 | Keil et al. | 455/611 |
| 4,689,795 | 8/1987 | Yoshimoto et al. | 372/31 |
| 4,713,841 | 12/1987 | Porter et al. | 359/186 |
| 5,153,765 | 10/1992 | Grunziger | 359/180 |
| 5,373,387 | 12/1994 | Bosch et al. | 359/187 |

FOREIGN PATENT DOCUMENTS

| | | | |
|---|---|---|---|
| 1229653 | 11/1987 | Canada | 315/24 |
| 3242481 | 5/1984 | Germany | H01S 3/10 |
| 62-020388 | 1/1987 | Japan | H01S 3/133 |
| 63-027086 | 2/1988 | Japan | H01S 3/133 |

OTHER PUBLICATIONS

"GaAlAs Laser Transmitter For Lightwave Transmission Systems", *The Bell System Technical Journal*, vol. 57, No. 6, Jul.–Aug. 1978, P. W. Shumate, Jr., F. S. Chen, and P. W. Dorman, pp. 1823–1836.

"Laser Level Control For High Bit Rate Optical Fibre Systems", *13th Circuits and Systems International Symposium Proceedings*, Houston, Tex., Apr. 1980, D. W. Smith and T. G. Hodgkinson, pp. 926–930.

*Primary Examiner*—Leo H. Boudreau
*Assistant Examiner*—Kinfe-Michael Negash
*Attorney, Agent, or Firm*—Scott W. McLellan

[57] ABSTRACT

An amplitude control scheme for a high bit rate digital optical transmitter is disclosed. The data to be transmitted by the laser is pulse-width modulated by a low frequency signal. The pulse-width modulated signal is applied to the laser via a laser driver and to a mark density reference generator. The magnitude of the low frequency components from the mark density reference generator is a signal indicative of the desired amplitude of the laser light pulses. A back-face photodiode converts a portion of the laser light into an electrical signal, the magnitude of the low frequency portion thereof being a signal indicative of the actual amplitude of the laser light pulses. The actual amplitude of the laser light pulses is compared to the desired amplitude and the laser driver output amplitude may then adjusted to compensate for variations in the laser performance.

10 Claims, 2 Drawing Sheets

AMPLITUDE DETECTION SCHEME FOR OPTICAL TRANSMITTER CONTROL

BACKGROUND OF THE INVENTION

Cross-Reference to Related Application

This application is related to a co-pending patent application titled "Method For Controlling The Amplitude Of An Optical Signal", by F. L. Bosch and T. V. Nguyen, Ser. No. 08/136,503, filed simultaneously with, and assigned to the same assignee, as this application Field of the Invention The present invention relates to an amplitude detection scheme for an optical transmitter and, more particularly, to a detection scheme useful in providing control of laser modulation over the lifetime of the optical transmitter.

Description of the Prior Art

A continuing concern in the field of laser-based optical transmitters is the change in laser characteristics with temperature and aging. The change in laser characteristics manifests itself as a combination of a shift in the laser threshold, (the current at which the laser begins lasing), and the L-I slope (the light output L vs. current I characteristic). As a result, special operating strategies for controlling the laser bias and modulation currents have been developed. In most cases, a photodiode is mounted in the same package as the laser and a portion of the light exiting the rear face of the laser is captured by the photodiode and used to monitor the laser performance. In particular, a feedback loop comparing the photodiode current to a reference signal maintains the average light output at a desired level by automatically adjusting the bias current. The reference signal is referred to here as a "mark density" reference signal, representing the average density over time of pulses which the laser converts into light. See, for example, an article entitled "GaAlAs Laser Transmitters for Lightwave Transmission Systems", appearing in the *Bell System Technical Journal*, Vol. 57, No. 6, July-August 1978, beginning at page 1823 and included herein by reference.

During initial use, and as long as only the laser threshold exhibits changes as a function of aging, the above photodiode monitor arrangement is suitable. However, when the laser L-I slope begins to change as a function of age, the light amplitude (and with it, the critical extinction ratio of ON-light to OFF-light) will change. Thus, a need remains for a means of controlling both the average light output and the light amplitude.

One arrangement proposed to provide this need is described in an article entitled "Laser Level Control for High Bit Rate Optical Fibre Systems", by D. W. Smith et al. and presented at the 13th Circuits and Systems International Symposium, Houston, Tex., April 1980 (appearing at pages 926–30 of the *Proceedings*). In this case, a low-frequency ON-state slope sensing arrangement, utilized in a high bit rate transmitter, permits indirect amplitude control. However, the arrangement as proposed works only with lasers having an exceptionally linear L-I slope, irrespective of temperature or aging. Typical lasers, however, have non-linear L-I slope which may render this approach unusable.

Thus, a need remains for a more robust arrangement for monitoring both average light and light amplitude in an optical transmitter that is usable with non-ideal lasers.

SUMMARY OF THE INVENTION

The need remaining in the prior art is addressed by the present invention which relates to an amplitude detection scheme for an optical transmitter and, more particularly, to a scheme useful in providing control of the laser modulation over the lifetime of the optical transmitter.

In accordance with an exemplary embodiment of the present invention, an apparatus is presented into the laser transmitter for monitoring and controlling the amplitude of a digital laser light output signal. In particular, the apparatus is characterized by a pulse width modulator for modulating the high bit rate input data signal with a low frequency modulating signal to form a pulse width modulated data signal, a laser driver (responsive to said pulse width modulated data signal and a control signal), for generating a drive signal to a laser with the amplitude thereof being substantially determined by the control signal, a photodetection means for generating a light amplitude monitor signal from the low frequency AC component of the optical output signal, and means for comparing the light amplitude monitor signal to a reference signal to provide as an output an amplitude error signal indicative of any difference in value between the light amplitude monitor and the reference signals. The amplitude control signal may be applied as the control signal input of the laser driver to control the amplitude of the laser light.

In a preferred embodiment of the present invention, the amplitude detection arrangement is used in conjunction with an average light output control, as provided by a conventional monitor photodiode. Therefore, a dual-loop control arrangement may be provided which includes correction for both average light and light amplitude.

Other and further embodiments and advantages of the present invention will become apparent during the course of the following discussion and by reference to the accompanying drawings.

BRIEF DESCRIPTION OF THE DRAWING

Referring now to the drawings.

DETAILED DESCRIPTION

Figure 1:
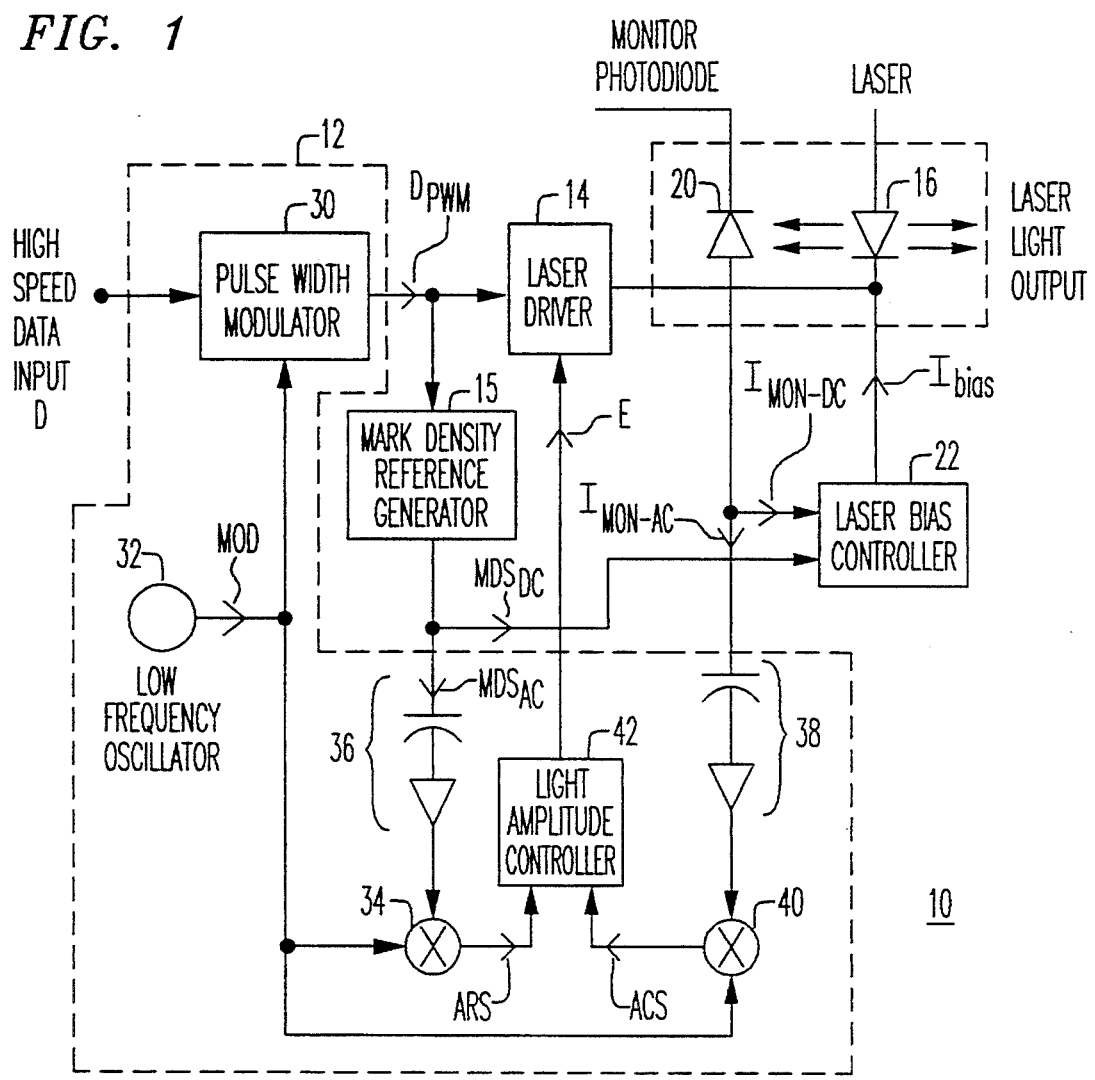
FIG. 1 illustrates an exemplary laser transmitter utilizing the amplitude detection and control arrangement of the present invention.

An exemplary digital lightwave transmitter 10 utilizing both average light and low frequency light amplitude control is illustrated in FIG. 1. In general, an incoming digital data signal (electrical) D, operating at a predetermined bit rate is coupled into the low frequency light amplitude control means 12. Low frequency means 12 will be discussed in more detail below. Data signal D subsequently passes through a laser driver 14 and is applied as the modulation input to a laser device 16. A bias current $I_{bias}$ is also applied as an input to laser device 16. The light output signal from laser device 16 may then be coupled into an optical fiber (not shown) to propagate along the signal path as a digital optical data signal.

As seen in FIG. 1, a portion of the optical output signal from laser device 16 also exits the rear face of the device and illuminates a monitor photodetector 20, here a photodiode. The optical signal is converted into an electrical current within monitor photodetector 20, denoted as $I_{MON}$. As is well-known in the art, $I_{MON}$ may be applied as a first input to a control means 22 for monitoring the average light output signal from laser device 16. As described above, $I_{MON}$ may be compared to the mark density level of the electrical pulses to the laser driver 14, a substantially DC signal, to provide any necessary adjustments to the level of $I_{BIAS}$ to maintain the desired average light output.

It is the control means 12, as will be described in greater detail hereinafter, that provides the additional ability to monitor and control the amplitude of the laser output signal.

As illustrated in the exemplary embodiment of FIG. 1, an exemplary high bit rate digital data stream D is being supplied as an input to control means 12. In accordance with the teachings of the present invention, that stream D is applied as a first input to a pulse width modulator 30. Data stream D is then pulse width modulated by a low frequency signal MOD from a low frequency oscillator 32 to form a pulse-width modulated data output signal $D_{PWM}$. The signal $D_{PWM}$ drives laser driver 14 which, in turn, drives the laser diode 16. As a consequence, the laser light pulses from diode 16 are also pulse-width modulated. For purposes of this discussion, the term "low frequency" refers to a signal having a frequency significantly lower than the frequency of the digital data that it modulates in pulse width modulator 30.

Figure 2:
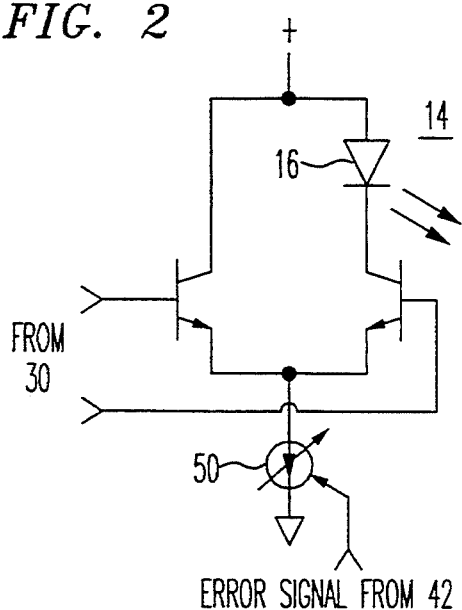
FIG. 2 is a simplified schematic diagram of the laser driver of FIG. 1.

An illustrative laser driver 14 is shown in FIG. 2. The driver 14 allows the laser light pulses to vary in amplitude depending on the current supplied by the current source 50, as will be discussed below.

Figure 3:
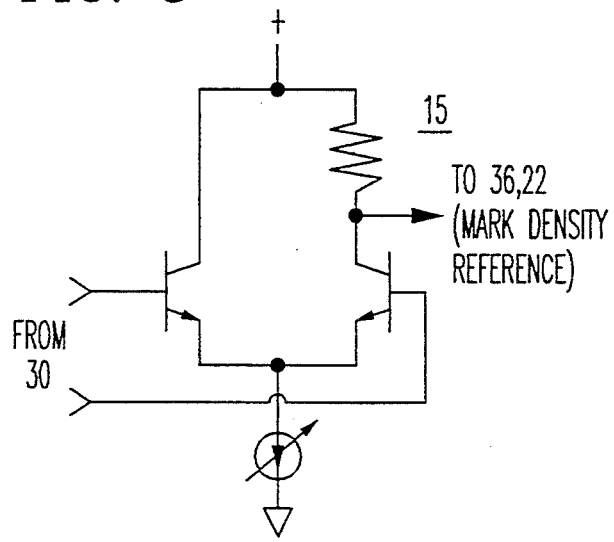
FIG. 3 is a simplified schematic diagram of the mark density reference generator of FIG. 1.

The pulse-width modulated data signal $D_{PWM}$ additionally drives a mark density reference generator 15 which generates a signal indicative of the density of the pulses applied to the laser 16. An exemplary generator 15 is shown in FIG. 3 and is similar to the laser driver 14 of FIG. 2 but with fixed bias (tail) current. Returning to FIG. 1, the signal from mark density reference generator 15 has two components, a DC component ($MDS_{DC}$) representing the average level of the pulses and an AC component ($MDS_{AC}$) representing, for purposes here, the effect of the pulse-width modulation on the data signal D. The DC component $MDS_{DC}$ is coupled to the laser bias control 22, discussed above. The AC component $MDS_{AC}$ is amplified by a low frequency AC-coupled amplifier 36 and demodulated to form an amplitude reference signal (ARS), as discussed below in more detail, since the signal to the mark density reference generator 15 has not yet passed through the laser 16. The ARS signal represents the desired amplitude of the laser light pulse.

As stated above, the laser light pulses from laser 16 will have the low frequency pulse width modulation impressed thereon. Monitor photodetector (photodiode) 20 will, therefore, re-convert this low frequency signal into an electrical equivalent which may then be evaluated to determine any change in the light amplitude of the laser output signal. In particular, the output signal from monitor photodetector 20 will contain both DC and AC components, the DC component ($I_{MON\text{-}DC}$) is related to the bias current, as described above. Therefore, the AC component $I_{MON\text{-}AC}$ may be amplified in a manner similar to the AC component of the mark density reference signal $MDS_{AC}$, utilizing a second low frequency AC-coupled amplifier 38 (wherein amplifier 38 should be essentially matched in performance to first amplifier 36). The signal $I_{MON\text{-}AC}$ is subsequently demodulated to generate an amplitude control signal, ACS. The signal ACS is indicative of the amplitude of the actual laser output signal. In accordance with present invention, this amplitude signal may be controlled by comparing the actual output signal ACS to the generated reference signal ARS within a light amplitude controller 42 to produce an error signal E. The output error signal E from controller 42 will provide an indication of any difference between these two signals and serves as a control signal to laser driver 14 to either increase or decrease the amplitude of the driver signal applied to the laser. Referring temporarily back to FIG. 2, the error signal E from controller 42 varies a current source 50 to adjust the amplitude of the current through the laser 16 and, hence the amplitude of the laser light output pulse therefrom.

Therefore, by appling pulse width modulation to the laser modulating current, and detecting the low frequency component in a monitor photodiode, a relative measure of the light amplitude may be obtained, and any changes in this amplitude be corrected.

The signals ARS and ACS are essentially indicative of the amplitude of the low frequency signals from corresponding amplifiers 36, 38. As such, the detectors may be conventional envelope detectors. However, it has been found that a conventional envelope detector is unsuitable due to the low signal levels and high noise environment within a laser transmitter package, i.e, the low frequency signals have a low signal-to-noise ratio. To improve the signal-to-noise ratio of the demodulation of the low frequency signals, it is preferred that synchronous demodulation be used to detect the modulating signal in the $D_{PWM}$ and $I_{MON\text{-}AC}$ signals. Thus, synchronous demodulators 34, 40, here shown as multipliers, utilize the low frequency modulation signal MOD as the demodulation reference signal.

It is noted that the low frequency oscillator 32 may produce a square wave, a sinusoidal wave, triangular wave, etc. or may be a random or pseudorandom signal. The frequency of the oscillator 32 should be lower than the data D bit rate, preferably two orders of magnitude or more lower.

Figure 4:
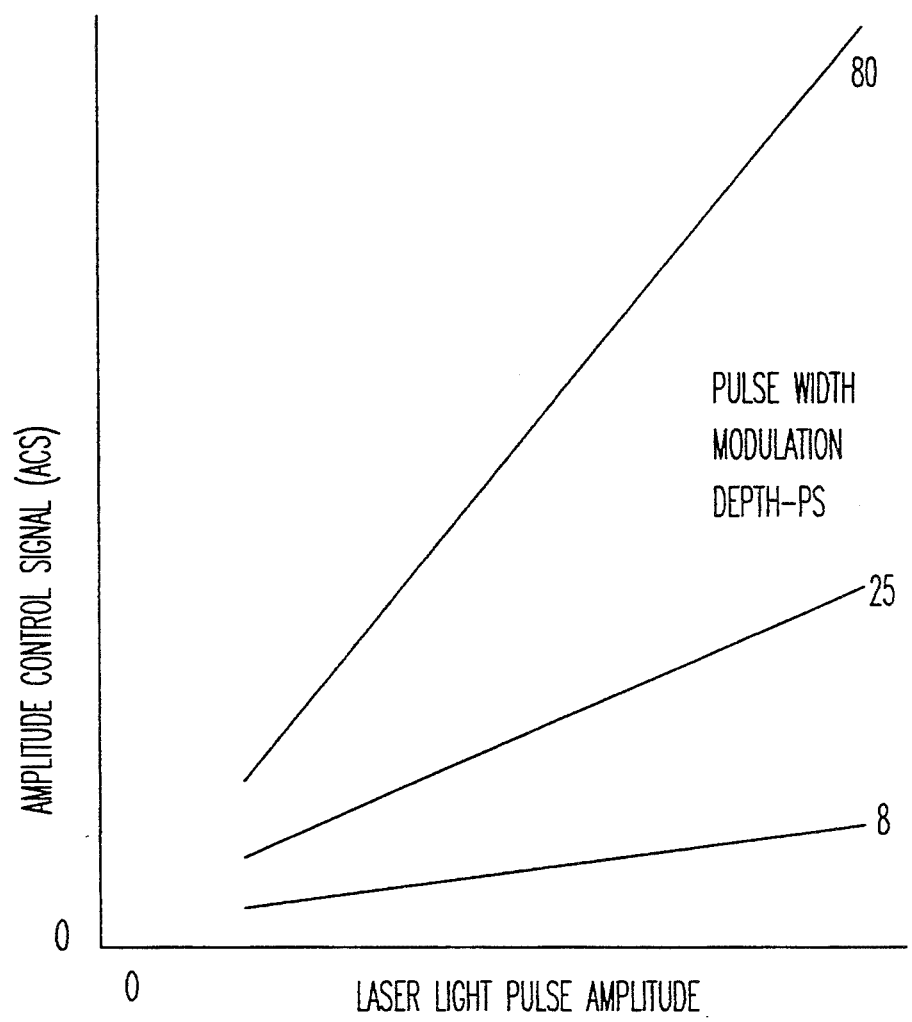
FIG. 4 is a plot (not to scale) of a light amplitude control signal measured against the laser light pulse amplitude for different modulation depths in one exemplary embodiment of the invention.

To confirm the above exemplary embodiment, portions of a digital laser transmitter have been fabricated and tested using a GaAs photodiode back-face monitor with a 1.3 µm multimode laser. The low frequency oscillator used was a 5 KHz square wave oscillator, pulse-width modulating a 1.1 Gb/s digital data signal at different modulation depths to produce data pulse width variations of 8, 25 and 80 ps. As shown in FIG. 4, the amplitude control signal (ACS, FIG. 1) was measured and was found to be linear with light amplitude from the laser 16. Further, the entire transmitter has been simulated using a data rate of 10 Mbits/sec and a low frequency modulation rate of 100 KHz. The laser was simulated to shift its threshold current and L-I slope by approximately 17 and 22 percent, respectively, while operating "closed loop" under the control of the light amplitude control means 12 (FIG. 1). The simulations verify that the means 12 does control the light amplitude from the laser 16 with the different L-I slopes and threshold shifts.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

We claim:

1. An apparatus for monitoring and controlling the amplitude of a digital laser light output signal, comprising:
   a pulse width modulator for modulating a high bit rate input data signal with a low frequency modulating signal to form a pulse width modulated data signal;
   a laser driver, responsive to the pulse width modulated data signal and a control signal, for generating a drive signal to a laser, the amplitude thereof being substantially determined by the control signal;
   photodetection means, responsive to an optical output signal from the laser and creating an electrical representation thereof, for generating a light amplitude control signal from the low frequency AC component of the electrical representation; and
   means for comparing the light amplitude control signal to a reference signal and providing as an output an amplitude error signal indicative of any difference in value between the light amplitude control and reference signals;
   wherein the amplitude error signal may be applied as the control signal input of the laser driver to control the amplitude of the laser light.

2. The apparatus as recited in claim 1, further characterized by:
   a low frequency oscillator for generating the low frequency signal;
   circuit means for deriving a light amplitude reference signal from the low frequency AC component of the pulse width modulated data signal; wherein the light amplitude reference signal is the reference signal applied to the comparing means.

3. The apparatus as recited in claim 2, wherein the circuit means and the photodetection means additionally generate a DC component signal representative of the average value of the pulse width modulated data signal and the optical output signal, respectively; and further comprising means, responsive to the DC component signals from the circuit means and the photodetection means, for providing a bias current to the laser in response to a difference in the DC component signals.

4. The apparatus as recited in claim 3, the photodetection means further comprising:
   a photodetector for creating the electrical representation of the laser output;
   a filter arrangement for passing the AC component of the electrical representation; and
   a synchronous demodulator, responsive to the filter arrangement and the low frequency oscillator, for generating the light amplitude monitor signal.

5. The apparatus as recited in claim 2, the circuit means further comprising:
   a filter arrangement for passing the AC component of the pulse width modulated data signal;
   a multiplier, responsive to the filter arrangement and the low frequency oscillator, for generating the light amplitude reference signal.

6. An arrangement as defined in claim 5 wherein the low frequency oscillator provides as an output a square wave low frequency signal.

7. An arrangement as defined in claim 5 wherein the low frequency oscillator provides as an output a sine wave low frequency signal.

8. A digital lightwave transmitter comprising:
   a laser diode responsive to both a digital modulation signal and a bias signal for forming an optical digital output signal therefrom;
   a monitor photodetector coupled to the back-face of the laser diode for coupling a portion of the optical digital output signal and deriving an electrical control signal $I_{MON}$ therefrom;
   means for driving the laser diode with the digital modulation signal; and
   bias control means responsive to a DC reference signal from the driving means and a DC monitor signal from the photodiode for providing a corrective bias signal in response to a difference in value between the applied DC signals;
   a low frequency oscillator, for producing a modulating signal at a predetermined low frequency;
   a pulse width modulator responsive to both an input digital data signal and the modulating signal for providing as an output a pulse width modulated digital data signal, wherein the pulse width modulated digital data signal is applied as an input to the means for driving the laser diode;
   means for extracting the AC component of the driving means output signal and multiplying the AC component with the low frequency reference signal to form a light amplitude reference signal;
   means for extracting the AC component of the monitor photodiode output signal and multiplying the AC component with the low frequency reference signal to form a light amplitude monitor signal indicative of the amplitude of the digital output signal; and
   means for comparing the light amplitude reference signal to the light amplitude monitor signal and providing an output control signal indicative of any difference between the light amplitude signals, wherein the output control signal is applied as an input to the driving means to adjust the amplitude of the digital data signal applied as an input thereto.

9. A lightwave transmitter as defined in claim 8 wherein the transmitter further comprises means for comparing the DC component of the reference signal to the DC component of the monitor signal and provide as an output a control signal to the bias current, indicative of any difference in the values of the DC inputs.

10. A lightwave transmitter as defined in claim 9 wherein a first low frequency amplifier is used to amplify the AC component or the reference signal and a second low frequency amplifier is used to amplify the AC component of the monitor signal.

* * * * *